US006893957B2

(12) United States Patent
Trivedi et al.

(10) Patent No.: US 6,893,957 B2
(45) Date of Patent: May 17, 2005

(54) METHOD OF FORMING A DUAL DAMASCENE INTERCONNECT BY SELECTIVE METAL DEPOSITION

(75) Inventors: Jigish D. Trivedi, Boise, ID (US); Mike P. Violette, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/038,305

(22) Filed: Jan. 2, 2002

(65) Prior Publication Data

US 2002/0061645 A1 May 23, 2002

Related U.S. Application Data

(62) Division of application No. 09/548,472, filed on Apr. 13, 2000, now Pat. No. 6,534,866.

(51) Int. Cl.[7] .................... H01L 21/44; H01L 21/4763
(52) U.S. Cl. .................... 438/632; 438/637; 438/638; 438/641; 438/685; 438/688
(58) Field of Search .................... 438/632–633, 438/637–641, 643–644, 627–629, 648, 650–654, 656, 665, 672–675, 685, 687–688, 668

(56) References Cited

U.S. PATENT DOCUMENTS

| 4,804,560 A | 2/1989 | Shioya et al. |
| 5,677,237 A | 10/1997 | Tsai et al. |
| 5,714,804 A | 2/1998 | Miller et al. |
| 5,739,579 A | 4/1998 | Chiang et al. .............. 251/635 |
| 5,840,625 A | 11/1998 | Feldner |

(Continued)

FOREIGN PATENT DOCUMENTS

| JP | 9532478 | 2/1995 |
| JP | 8227939 | 9/1996 |

OTHER PUBLICATIONS

Miller et al., "CVD Tungsten Interconnect and Contact Barrier Technology for VLSI," Solid State Technology, Dec. 1982, pp. 85–90.
Saraswat, et al. "Selective CVD of Tungsten for VLSI Technology," Journal of the Electrochemical Society, vol. 131, No. 3, 1984, pp. 409–419.
Stacy et al."Interfacial Structure of Tungsten Layers Formed by Selective Low Pressure Chemical Vapor Deposition," J. Electrochem. Soc.: Solid State Science and Technology, vol. 132, No. 2, Feb. 1985, pp. 444–448.

*Primary Examiner*—Thanh Nguyen
(74) *Attorney, Agent, or Firm*—Knobbe, Martens, Olson & Bear, LLP

(57) ABSTRACT

A dual damascene process is disclosed, in which a contact via and trench pattern is etched into insulating layer(s). The via is first partially filled by selective metal (e.g., tungsten) deposition, thereby forming a partial plug that raises the floor and reduces the effective aspect ratio of the trench and via structure. The remaining portion of the contact via is then filled with a more conductive material (e.g., aluminum). This deposition also at least partially fills the overlying trench to form metal runners. In the illustrated embodiment, hot aluminum deposition fills the portion of the contact via left unoccupied by the selective deposition and overfills into the trench. A further, cold aluminum deposition then follows, topping off the trench prior to planarization. The dual damascene structure thus exhibits a raised floor relative to conventional dual damascene metallization, while still retaining the conduction benefits of aluminum through a significant portion of the contact and the metal runner formed in the trench.

16 Claims, 7 Drawing Sheets

U.S. PATENT DOCUMENTS

| | | | |
|---|---|---|---|
| 5,990,011 A | 11/1999 | McTeer | 438/692 |
| 6,028,362 A * | 2/2000 | Omura | 257/751 |
| 6,156,651 A * | 12/2000 | Havemann | 438/626 |
| 6,211,085 B1 * | 4/2001 | Liu | 438/624 |
| 6,235,603 B1 | 5/2001 | Melnick et al. | |
| 6,239,021 B1 | 5/2001 | Pramanick et al. | 438/627 |
| 6,258,707 B1 | 7/2001 | Uzoh | 438/618 |
| 6,271,596 B1 | 8/2001 | Alers | 257/774 |
| 6,365,514 B1 * | 4/2002 | Yu et al. | 438/675 |
| 6,380,073 B1 | 4/2002 | Hwang et al. | 438/597 |
| 2002/0195715 A1 | 12/2002 | Cho | |

* cited by examiner

METHOD OF FORMING A DUAL DAMASCENE INTERCONNECT BY SELECTIVE METAL DEPOSITION

REFERENCE TO RELATED APPLICATION

This application is a divisional of application Ser. No. 09/548,472, filed Apr. 13, 2000 U.S. Pat. No. 6,534,866.

FIELD OF THE INVENTION

The present invention relates generally to the fabrication of multi-layer integrated circuits, and more particularly to contact formation in a dual damascene interconnect scheme.

BACKGROUND OF THE INVENTION

There are numerous semiconductor process steps involved in the development of modem day integrated circuits (ICs). From the initial fabrication of silicon substrates to final packaging and testing, integrated circuit manufacturing involves many fabrication steps, including photolithography, doping, etching and thin film deposition. As a result of these processes, integrated circuits are formed of microscopic devices and wiring amid multiple layers.

Contact vias or openings are commonly formed in insulating materials known as interlevel dielectrics (ILDs). The vias are then filled with conductive material, thereby interconnecting electrical devices and wiring at various levels. Damascene processing similarly involves etching trenches in insulating layers in a desired pattern for a wiring layer. These trenches are then filled with conductive material to produce the integrated wires. Where contact vias, extending downwardly from the bottom of the trenches, are simultaneously filled, the process is known as dual damascene.

The integrated wires that interconnect between different active devices should be fabricated of a relatively low resistivity material. Aluminum (Al), for example, has generally prevailed as the material of choice in the development of integrated wires or "runners" because of its low resistivity (~2.7 $\mu\Omega$-cm). Other favorable characteristics of aluminum include good adhesion to insulation layers such as silicon oxide surfaces ($SiO_2$). Copper demonstrates even lower resistivity, though it introduces its own difficulties in integration.

Ideally, highly conductive metals should be employed not only in lateral runners, but also in vertical contact regions. Contact openings, however, are being developed with higher aspect ratios (A/R), such that aluminum can not adequately fill the contact openings by conventional physical vapor deposition (PVD) sputtering. Imperfect aluminum deposition also results in electromigration at points of inadequate fill, especially in the contact regions where there are generally large current densities. Furthermore, Al—Si contact interfaces are prone to junction spiking resulting in large leakage currents or even electrical shorts.

On the other hand, metals for which chemical vapor deposition (CVD) are well developed, such as tungsten (W) are most often employed for filling contact openings with high aspect ratios. Tungsten (W) exhibits excellent resistance to electromigration effects, hillock formation, and humidity-induced corrosion. Since W can be deposited by means of CVD, it allows much better step coverage that can be obtained by sputter-deposited or evaporated films (e.g., Al films). The downside corollary to depositing W is its relatively high resistivity (~6–15 $\mu\Omega$-cm). Moreover, separate plug and wiring formation is less efficient than simultaneous formation using dual damascene process flows.

There is consequently a need for improved methods and structures for integrated circuit interconnects, including contacts or plugs and metal runners.

SUMMARY OF THE INVENTION

These and other needs are satisfied by several aspects of the present invention.

In accordance with one aspect of the invention, an interconnect structure is provided. The interconnect is provided in a dual damascene contact via and an overlying trench, which are in turn formed in insulating material of an integrated circuit. The contact via is partially filled with tungsten that has a greater thickness over a bottom surface of the contact via than over any surface of the trench. A second metal that is more conductive than tungsten fills an upper portion of the contact via, over the tungsten, and at least partially fills the trench.

In accordance with another aspect of the invention, an integrated circuit, is provided with a generally horizontal metal runner in an upper insulating layer. At least a lower portion of the metal runner includes a metal. A generally vertical contact extends downwardly through a lower insulating layer from the metal runner to a lower conductive element. The contact includes an upper portion of the contact formed of the first metal. The upper portion is integrally formed with the lower portion of the metal runner. A lower portion of the contact includes a less conductive material than the metal. The thickness of this lower portion extends between about one-third and two-thirds of a contact height defined between the lower conductive element and the metal runner.

In accordance with another aspect of the invention, a system that includes an integrated contact plug is provided. The plug has a contact height between a lower surface and an upper surface. The contact plug includes a tungsten layer having a thickness over the lower surface equal to between about one-third and two-thirds of the contact height. An aluminum layer extends from the tungsten layer to the upper surface.

In accordance with another aspect of the invention, an integral metallization structure is provided in an integrated circuit. The structure includes a metal runner with a first metal layer. This first metal layer extends downwardly into an upper portion of an underlying contact. The underlying contact also includes a lower portion formed of a second metal layer that extends from the first metal layer downwardly to a contact landing pad.

In accordance with another aspect of the invention, a method is provided for forming an integrated circuit. The method includes forming a dual damascene structure in insulating material over a semiconductor substrate. This dual damascene structure includes a trench and a contact via that extends from the bottom of the trench to expose a conductive element. A first metal is deposited selectively over the conductive element, relative to insulating surfaces of the dual damascene structure, to partially fill the contact via. The remainder of the contact via is then filled with a second metal, which is more conductive than the first metal.

In accordance with another aspect of the invention, a method is provided for fabricating an integrated circuit interconnect structure. A pattern of dual damascene trenches and contact vias is etched in insulating material. A first metal then preferentially deposits into the contact vias to partially fill the contact vias. A second metal layer is then deposited by physical vapor deposition to fill a remaining portion of the contact vias over the first metal and to at least partially fill the trenches.

BRIEF DESCRIPTION OF THE DRAWINGS

These and further aspects of the invention will be readily apparent to those skilled in the art from the following description and the attached drawings, which are meant to illustrate and not to limit the invention, and wherein.

DETAILED DESCRIPTION OF THE PREFERRED EMBODIMENT

The preferred embodiments are illustrated in the context of metallization processes in an integrated circuit, including contact plug formation and damascene processes, where selective tungsten (W) partially fills a void and aluminum is sputtered thereover. The skilled artisan will readily appreciate, however, that the materials and methods disclosed herein will have application in a number of other contexts where contact openings are partially filled with a first conductive layer, desirably followed by a more suitable subsequent conductive layer.

Figure 1:
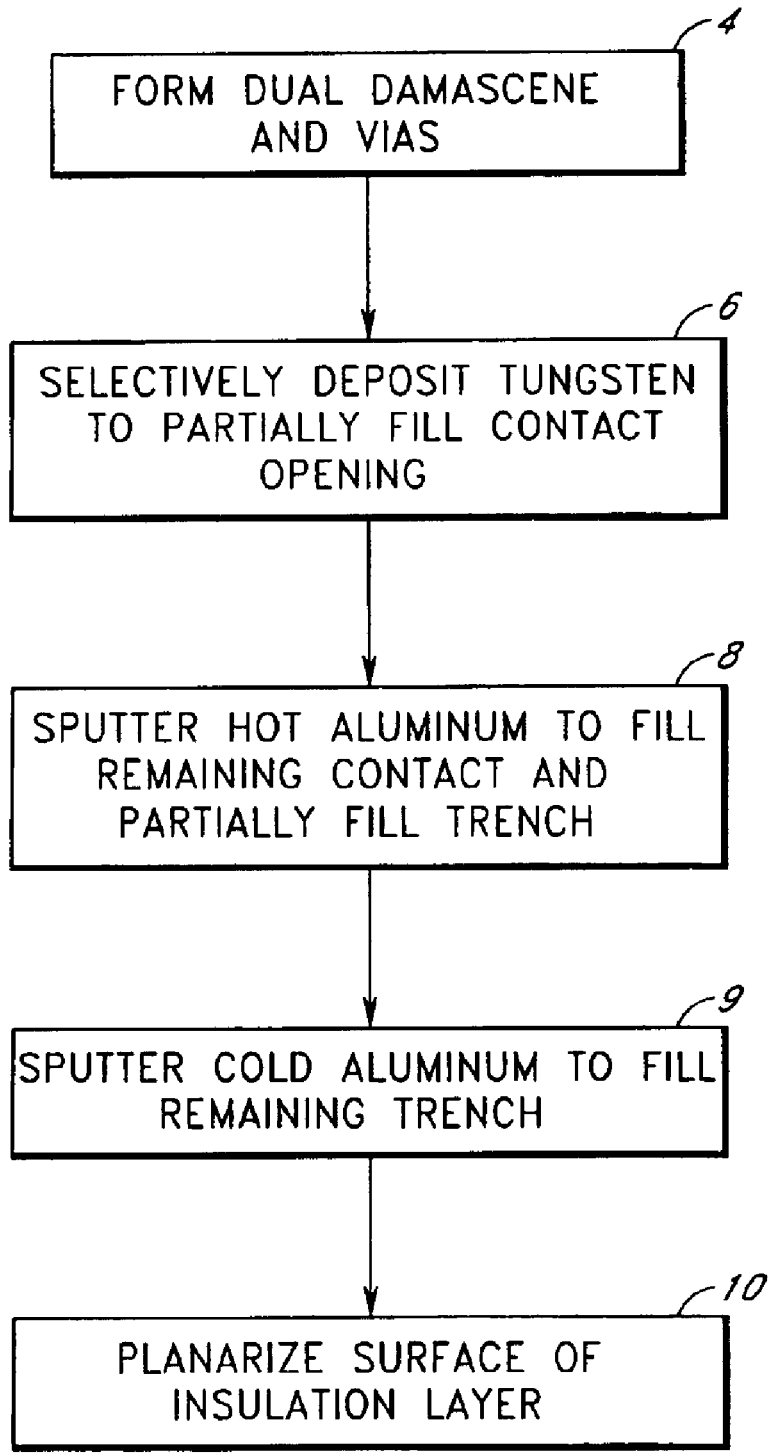
FIG. 1 is flow chart illustrating the sequential steps in forming the dual damascene structure of the preferred embodiment.

FIG. 1 schematically illustrates a process flow for forming a partial contact plug over which further metal can be deposited in accordance with a preferred embodiment of the invention. As shown, the process begins with formation 4 of a dual damascene structure comprising trenches and vias. The trenches and vias may be formed using conventional photolithography and etch technologies.

While not shown, the skilled artisan will appreciate that the vias and trenches can at this point be lined with adhesion and/or barrier layers. Desirably, any such layers are as thin as possible for their assigned function. Typical liners include titanium, titanium nitride, tantalum, tantalum nitride, other refractory metals, metal nitrides, and combinations of the same.

Subsequently, the via is partially filled 6 with a conductive material, preferably in a batch processing tool, more preferably in a continuous deposition process. In the illustrated embodiment, the tool comprises a hot wall, low-pressure chemical vapor deposition (LPCVD) reactor. The deposition comprises a selective or preferential metal deposition described, and more particularly selective tungsten deposition, as described in more detail below. The skilled artisan will readily appreciate, however, that the principles disclosed herein can be applied to other types of selective deposition and tools therefor.

As illustrated, the next process step is the formation 8 of a more conductive layer above the selectively deposited tungsten (W) layer. The more conductive layer is preferably deposited by physical vapor deposition (PVD), such as sputtering, and in the illustrated embodiment the deposition comprises a hot aluminum process. The skilled artisan will readily appreciate, however, that the principles herein can be applied to other types of deposition, such as chemical vapor deposition (CVD).

The illustrated process flow also includes a subsequent formation 9 of a second conductive filler material over the first material. In the preferred embodiment, forming the second filler material comprises depositing aluminum in a "cold" sputter process over the hot deposited aluminum layer. The second filler material can thus be formed in the same PVD sputtering tool with the same process parameters used for the formation 8 of the hot aluminum, except for the temperature range.

The next process step, according to FIG. 1, is the planarization 10 of the workpiece surface. In the illustrated embodiment, the planarization comprises a polishing or mechanical abrasion, more preferably chemically aided by slurry provided between the polishing pad and the workpiece. Such a planarization process is widely referred to in the industry as a chemical and mechanical polishing (CMP) process. In other arrangements, the skilled artisan will appreciate that etchback processes such as reactive ion etching (RIE) can also effectively remove horizontal surfaces of a workpiece.

FIGS. 2–6 illustrate structures that result from the process described generally above with respect to FIG. 1.

Figure 2:
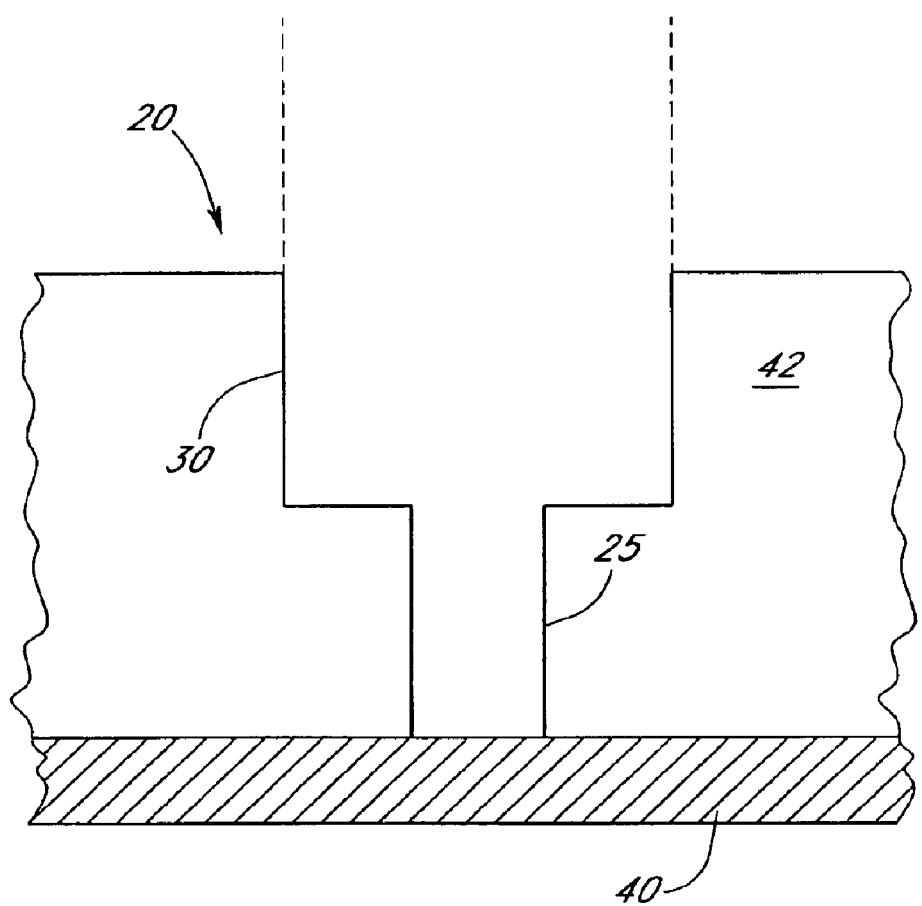
FIG. 2 is a schematic cross-section of a partially fabricated integrated circuit, illustrating a dual damascene structure comprising a trench and a via.

With reference initially to FIG. 2, a partially fabricated integrated circuit is shown on a workpiece or substrate assembly 20. The structure is formed above a substrate (not shown), which may comprise a single-crystal silicon wafer or other semiconductor layer in which active or operable portions of electrical devices are formed. An interlevel dielectric (ILD) 42 is formed above the substrate. Typical ILD materials include oxides formed from tetraethylorthosilicate (TEOS), borophosphosilicate glass (BPSG), polyamide, etc., and the illustrated ILD 42 comprises BPSG. The ILD 42 has a thickness adequate to electrically insulate underlying conductors from overlying conductors, which depends upon circuit design and operational parameters. In the illustrated embodiment, where the substrate assembly 20 represents a static random access memory (SRAM) or dynamic random access memory (DRAM) circuit, the ILD 42 preferably has a thickness between about 6,000 Å and 16,000 Å, desirably on the order of about 9,000 Å.

As shown in FIG. 2, a dual damascene structure is formed within the ILD 42. The skilled artisan will readily appreciate that the ILD 42 thus generally includes two separately formed, planarized insulating layers, typically separated by an etch stop or hard mask layer. The dual damascene structure preferably comprises a first opening that exposes an underlying conductive circuit element. In the illustrated embodiment, the first opening comprises an intermetal contact via 25, though in other arrangements the opening can comprise a contact opening to the semiconductor substrate. For current state-of-the-art circuit designs, the via 25 has a width of less than about 0.25 µm, more preferably less than about 0.20 µm, and a depth of about 2,000 Å to 4,000 Å. Such narrow dimensions result in aspect ratios (height:width) greater than about 1:1, and more preferably greater than about 2:1. In the illustrated embodiment, a metal-to-metal contact is to be formed in the via 25 having an aspect ratio between about 1:1 and 3:1. Aspect ratios in future generation integrated circuits will likely be higher still, since parasitic capacitance concerns limit ILD thickness scaling while lateral dimensions continued to be scaled. Conventional photolithography techniques can be employed to define the via 25, and anisotropic etching (e.g., reactive ion etching) is preferred for producing vertical via sidewalls.

The dual damascene structure also preferably comprises a second opening. In the preferred embodiment, the second opening comprises a wiring trench 30 that overlies the contact via 25. Similar to the via 25, conventional photolithography techniques can be employed to define the wiring trench 30, and anisotropic etching (e.g., reactive ion etching) is preferred for producing vertical via sidewalls. Preferably, in the illustrated embodiment, the wiring trench 25 has a width of less than about 1 μm, more preferably less than about 0.5 μm.

The skilled artisan will readily appreciate many manners of forming the dual damascene structure of FIG. 2. For example, such structures can be formed by sequential masking steps forming the trenches in wiring patterns followed by vias or openings extending from the bottom of the trenches, or by forming a buried hard mask for the vias and simultaneously etching through a photoresist mask defining the trenches and the hard mask.

The illustrated circuit element exposed by the openings comprises a contact landing pad of an underlying conductive runner or wiring layer 40. The wiring layer 40 preferably comprises copper, aluminum or alloys thereof, though the skilled artisan will appreciate that other conductive materials may be suitable, depending upon the function and desired conductivity of the circuit element. For example, in other arrangements, the lower circuit element can comprise a tungsten or polysilicon feature (e.g., local interconnect or contact).

Figure 3A:
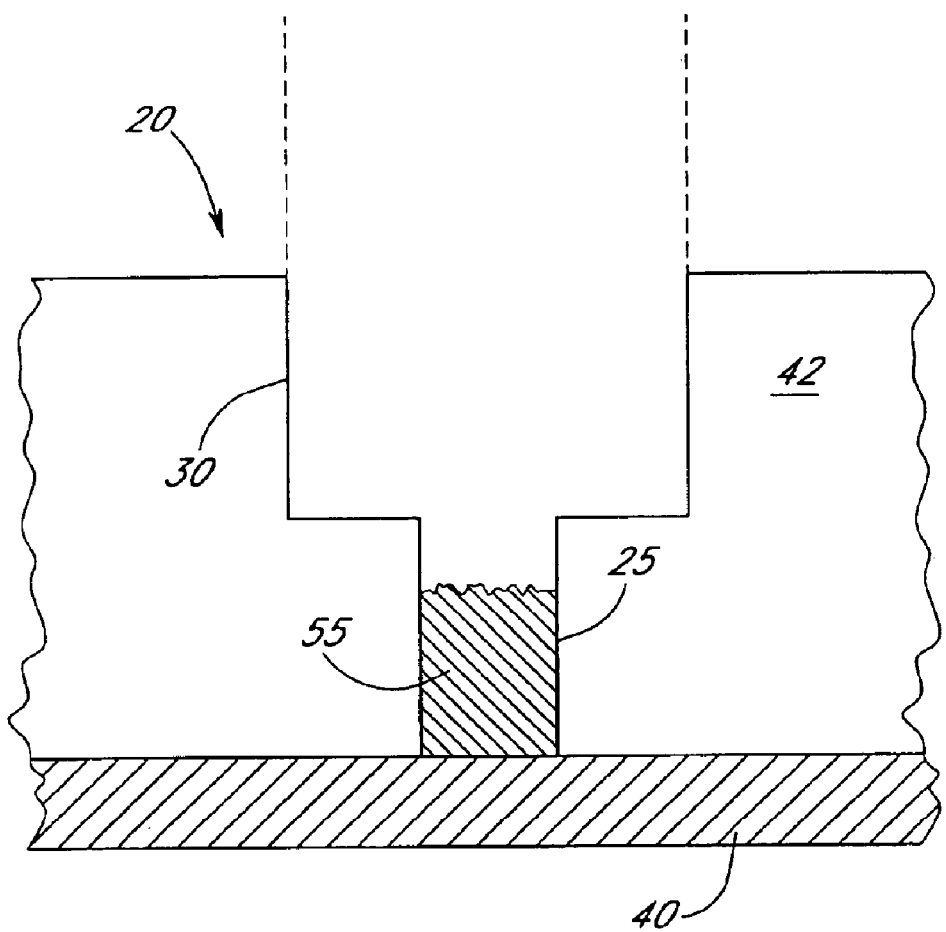
FIG. 3A is a schematic cross-section of a partially fabricated integrated circuit, illustrating a fully selective tungsten layer partially filling the via of FIG. 2.
Figure 3B:
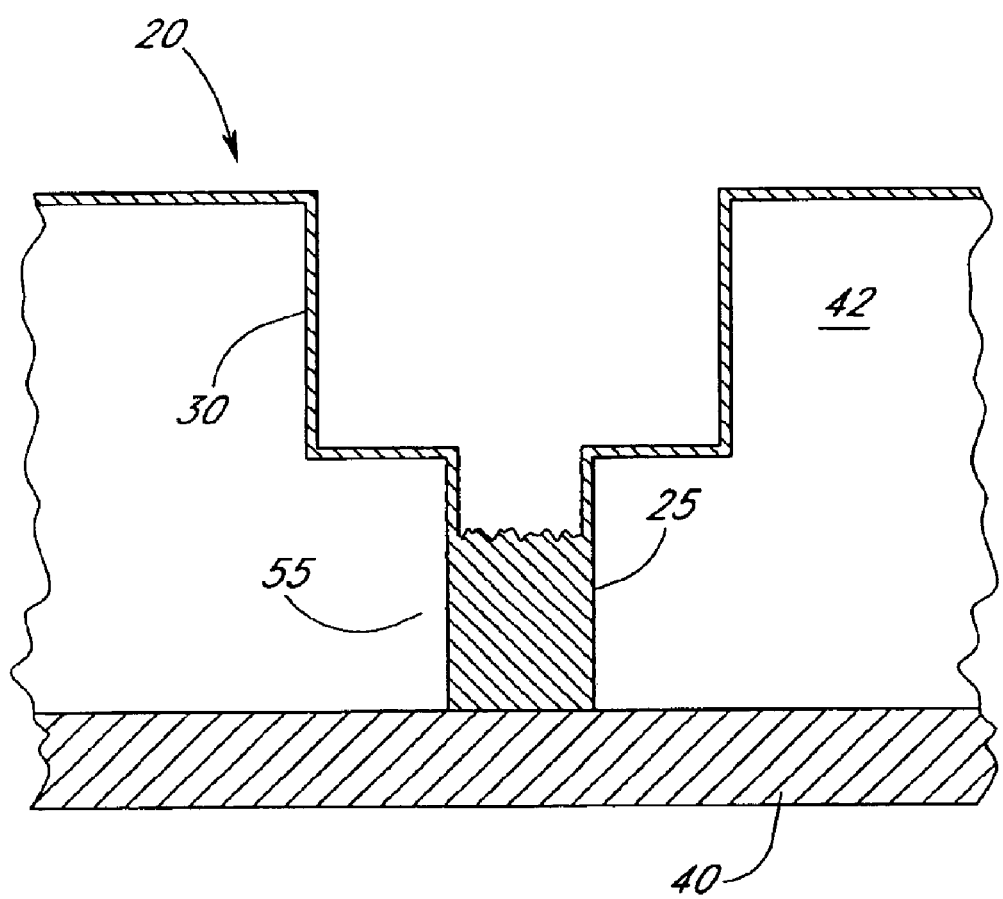
FIG. 3B is a schematic cross-section of a partially fabricated integrated circuit, illustrating a partially selective tungsten layer partially filling the via of FIG. 2.

Referring to FIG. 3A, a conductive partial plug 55 is selectively deposited to partially fill the via 25. As noted with respect to FIG. 1, the preferred embodiments employ a selective or preferential metal deposition, particularly selective tungsten (W) deposition, such that more metal is deposited at the bottom surface of the via 25 (i.e., over the conductor 40) than on insulating surfaces of the dual damascene structure. The partial plug 55 preferably extends from the bottom of the via 25 to between about ⅓ to ⅔ of the via 25 height, more preferably to between about ½ to ⅔ of the via height. In the embodiment of FIG. 3A, the deposition is shown as completely selective. Preferably, the partial plug 55 also occupies between about ⅓ to ⅔ of the via 25 volume, more preferably between about ½ to To provide the desired advantages, however, it is not critical for the partial plug 55 deposition to be completely selective within the via 25. As is illustrated in FIG. 3B, therefore, deposition of the partial plug 55 can be accompanied by a lesser deposition of the conductive material over exposed top surfaces of the ILD 42. Any such deposition preferably results in less than about 500 Å, more preferably less than about 100 Å over the insulating surfaces. The ratio of deposition thickness within the via 25 to deposition within the trench 30 to deposition over insulating surfaces is thus preferably greater than about 10:1, more preferably greater than about 20:1. Most preferably, the deposition is perfectly selective.

Generally, parameters that reduce the selectivity of W deposition are relatively higher process temperatures (i.e., greater than about 500° C.), relatively higher total and/or $WF_6$ partial pressure and longer deposition times (i.e., higher W thickness). Also, if wafers are not cleaned properly, nucleation of W can take place on surrounding insulation layers such as $SiO_2$. Accordingly, the workpiece is preferably first cleaned by argon or hydrogen plasma and/or wet cleans.

Selective tungsten deposition in accordance with the illustrated embodiment is conducted in any suitable reactor, and the illustrated embodiment employs a hot-wall LPCVD reactor (not shown). The skilled artisan will recognize that other CVD equipment can also be used. The hot-wall reactor comprises resistive heating elements, gas inlet ports for gas mixture entry and outlet ports for residual gases to exit through.

The gas inlet ports provide an inert carrier gas, preferably nitrogen gas ($N_2$), for purging of the reactor chamber before and after wafer processing. Additionally, The gas inlet ports provide an inert carrier gas, preferably nitrogen gas ($N_2$), for purging of the reactor chamber before and after wafer processing. Additionally, reactant gases for a selective deposition, namely hydrogen ($H_2$) and tungsten hexafluoride ($WF_6$) gases in the illustrated embodiment, are introduced to the reactor chamber during selective tungsten deposition.

The workpiece 20 is placed in the reactor chamber. In the preferred embodiment, the reactor chamber temperature is ramped between about 200° C. and 600° C., and the total chamber pressure is preferably between about 4 Torr and 15 Torr.

Hydrogen ($H_2$) gas is introduced into the reactor chamber at a rate of between about 5 sccm and 300 sccm. Tungsten hexafluoride ($WF_6$) flows at a rate of between about 5 sccm and 300 sccm. Deposition under these conditions is preferably conducted for a time period sufficient to form the thickness as described herein above.

Under the preferred deposition conditions described above, hydrogen ($H_2$) reduces tungsten hexafluoride ($WF_6$) selectively at the surface of the conductor 40 to produce the partial plug 55 according the following equation:

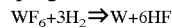
$WF_6 + 3H_2 \Rightarrow W + 6HF$

The skilled artisan will readily appreciate that other methods can be employed to selectively deposit a conductive material over the landing pad 40, such as to form a partial plug 55. In still other arrangements, the partial plug can be formed by blanket deposition and directional etchback of a conductive material.

Figure 4:
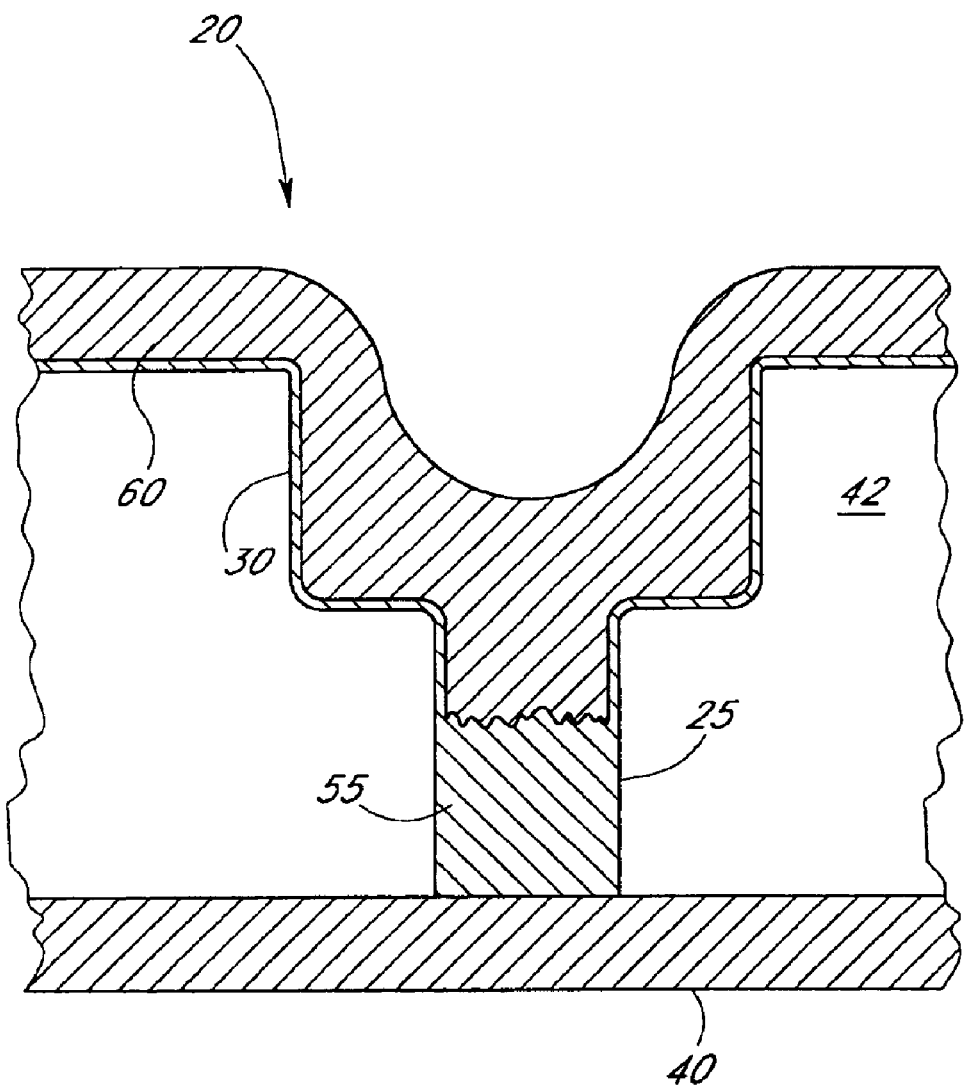
FIG. 4 is a schematic cross-section of a partially fabricated integrated circuit, illustrating a hot aluminum layer deposited over the tungsten layer of FIG. 3B.

Referring to FIG. 4, an initial filler metal 60, preferably more conductive than W, is subsequently deposited on the workpiece 20. In the illustrated embodiment, the more conductive filler metal 60 comprises hot aluminum, preferably deposited with a thickness to completely fill the remaining portion of the via 25 and partially fill the overlying wiring trench 30. Preferably, the deposited thickness of the hot aluminum layer 60 is between about 4,000 Å and 12,000 Å, more preferably between about 6,000 Å and 8,000 Å. Desirably, the aluminum is deposited to a thickness of about 1.5 times the depth of the trench 30.

Sputtering in accordance with the illustrated embodiment is conducted in any suitable chamber, and the illustrated embodiment employs a DC magnetron sputtering recognize that other sputtering equipment can also be used. The chamber houses a target cathode (Al in the illustrated embodiment) and a pedestal anode. In other arrangements, the chamber walls can form the anode.

A gas inlet into the chamber includes a heavy inert gas, preferably argon (Ar), for bombarding the target when a plasma is activated within the chamber. Additionally, a carrier gas, such as hydrogen gas ($H_2$) is preferably also introduced into the sputtering chamber to aid in supporting an active plasma within the chamber.

Exemplary process parameters include argon gas flow (e.g., 50–100 sccm), hydrogen gas flow and sputtering power preferably of about 1–3 kW. For the preferred hot aluminum process, chamber pressure is preferably maintained at between about 2 mTorr and 8 mTorr, and more preferably between about 3 mTorr to 4 mTorr. The workpiece 20 is heated during sputtering to a process temperature range preferably between about 400° C. and 550° C., more preferably between about 450° C. and 500° C. Under such conditions, aluminum is allowed to flow over the hot workpiece surfaces, tending to fill low spots such as the remaining portion of the contact vias 25. The skilled artisan will readily appreciate that these parameters can be adjusted for sputtering chambers of different volumes, electrode areas and electrode spacing.

Under the preferred sputtering conditions described above, Ar ions strike the Al target, liberating aluminum atoms that fall towards and deposit on the workpiece 20 below. Deposition under these conditions is preferably conducted for a time period sufficient to at least fill the remaining portion of the via 24 and to partially fill the overlying trench 30, as shown.

Figure 5:
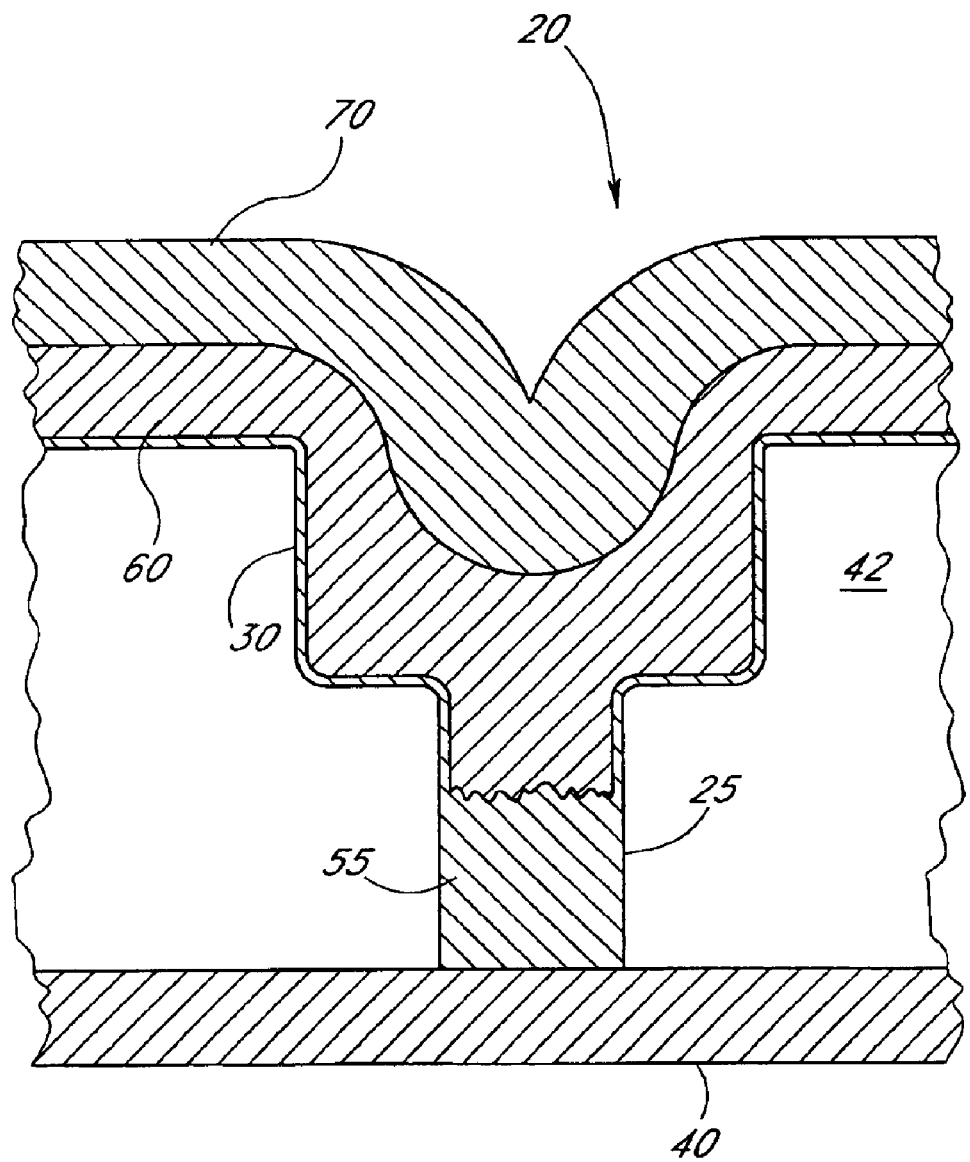
FIG. 5 is a schematic cross-section of a partially fabricated integrated circuit, illustrating a cold aluminum layer deposited over the hot aluminum layer of FIG. 4.

FIG. 5 illustrates a second filler metal 70. The second filler metal 70 of the illustrated embodiment comprises a cold deposited aluminum formed directly over the hot aluminum layer 60, preferably in the same process chamber in which the hot aluminum layer 60 was formed. The cold aluminum layer 70 is preferably deposited with a thickness to at least completely fill the trench 30, preferably to a thickness between about 4,000 Å and 8,000 Å, more preferably between about 5,000 Å and 6,000 Å.

Step coverage is not as critical towards the top of the trench structure. Accordingly, the temperature of the workpiece can be reduced during the second stage deposition to conserve thermal budgets and minimize damage to underlying components. Accordingly, the temperature is preferably reduced to between about 200° C. and 400° C., more preferably between about 250° C. and 350° C. Deposition under these conditions is preferably conducted for a time period sufficient to adequately fill the remaining portion of the trench 30, as shown in FIG. 5.

Figure 6:
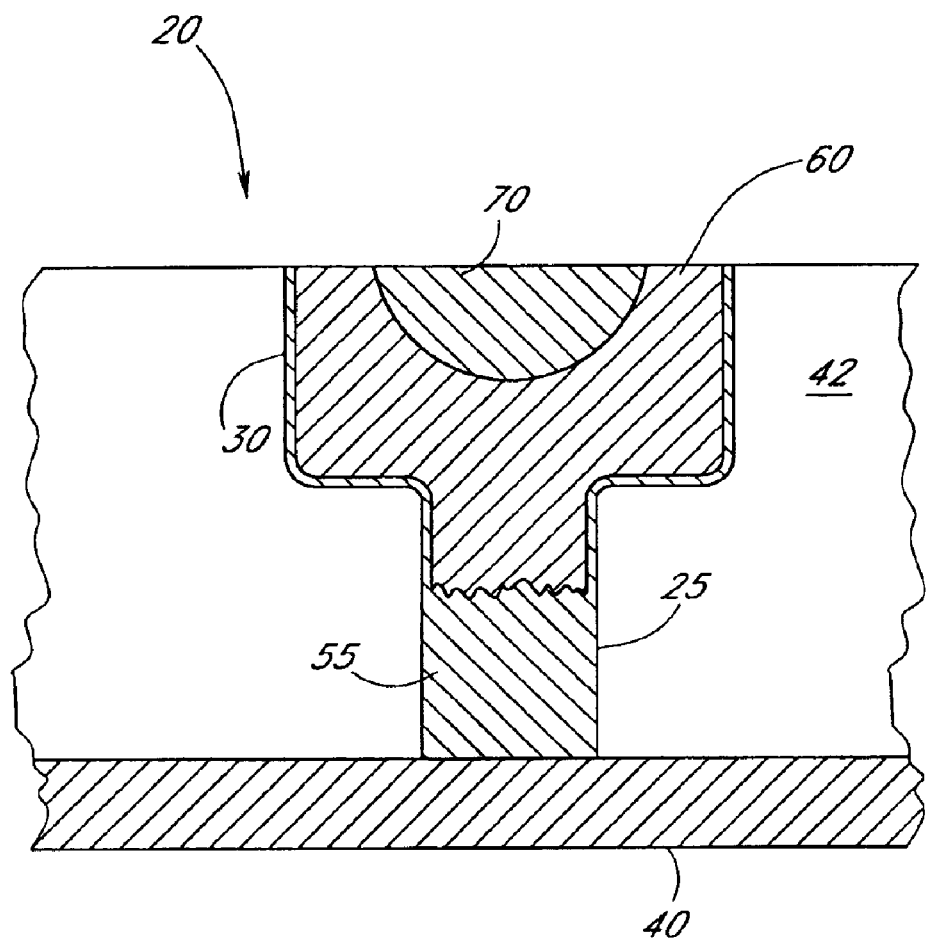
FIG. 6 is a schematic cross-section of a partially fabricated integrated circuit, illustrating the structure depicted in FIG. 5 after a planarization step.

With reference to FIG. 6, the dual damascene structure formation is subsequently planarized to leave an interconnect wire or "runner" comprising the filler metal(s) 60, 70 within the trenches 30. As noted, the structure is preferably planarized by chemical mechanical polishing (CMP) or other etchback process to leave isolated wiring lines within the trenches 30. Underlying the trenches 30 are plugs formed of the partial plug 55 and the portion of the filler metal(s) 60, 70 topping off the vias.

Accordingly, several objects and advantages inhere in the described invention. For example, W partially fills a contact opening, which effectively raises the contact floor of a dual damascene structure. Advantageously, the raised contact floor allows for a more conductive metal to be deposited by less conformal deposition, such as physical vapor deposition. Tungsten is adequately conductive for part of the contact plug and is minimally (if at all) deposited along the walls within the wiring trench. As a result, the remainder of the contact opening and most or all of the wiring trench is advantageously filled with a more conductive metal, such as aluminum.

Although this invention has been described in terms of a certain preferred embodiment and suggested possible modifications thereto, other embodiments and modifications that may suggest themselves and be apparent to those of ordinary skill in the art are also within the spirit and scope of this invention. Accordingly, the scope of this invention is intended to be defined by the claims that follow.

What is claimed is:
1. A method of forming an integrated circuit, comprising:
forming a dual damascene structure in insulating material over a semiconductor substrate, the dual damascene structure comprising a trench and a contact via extending from a bottom of the trench to expose a conductive element;
depositing a first metal selectively over the conductive element relative to insulating surfaces of the dual damascene structure to partially fill the contact via; and
filling a remainder of the contact via with a second metal, the second metal being more conductive than the first metal,
wherein depositing the first metal comprises filling the contact via to a height between about one-third and two-thirds of a height of the contact via.
2. The method of claim 1, wherein the first metal comprises tungsten and the second metal comprises aluminum.
3. The method of claim 1, wherein depositing comprises a selective chemical vapor deposition.
4. The method of claim 3, wherein depositing comprises depositing a ratio of first metal thickness over the conductive element to first metal thickness over insulating surfaces of the dual damascene structure of greater than about 10:1.
5. The method of claim 1, wherein filling comprises flowing aluminum at a temperature between about 400° C. and 550° C.
6. The method of claim 1, wherein depositing the first metal comprises filling the contact via to a height between about one-half and two-thirds of a height of the contact via.
7. The method of claim 1, wherein filling comprises overflowing the contact via to at least partially fill the trench with the second metal.
8. The method of claim 7, wherein filling comprises a hot aluminum deposition.
9. The method of claim 8, further comprising following the hot aluminum deposition with a cold aluminum deposition.
10. A method for forming an integrated contact plug, comprising:
forming a dual damascene contact via in insulating material, wherein the dual damascene contact via has a height extending from a conductive element at a bottom of the contact via to a bottom of a dual damascene trench directly over the contact via;
depositing a first metal to fill between about one-thirds and two-thirds of the height of the contact via; and
filling a remainder of the contact via with a second metal, wherein the second metal is more conductive than the first metal and partially fills the trench.
11. The method of claim 10, wherein depositing comprises filling the contact via to between about one-half and two-thirds of the height of the contact via.
12. The method of claim 10, wherein the first metal comprises tungsten.
13. The method of claim 10, wherein the second metal comprises aluminum.
14. The method of claim 10, wherein the contact via and the trench are lined with a barrier layer before depositing the first metal.
15. The method of claim 14, wherein the barrier layer comprises a metal nitride.
16. The method of claim 10, wherein the contact via and the trench are lined with an adhesion layer before depositing the first metal.

* * * * *

UNITED STATES PATENT AND TRADEMARK OFFICE
CERTIFICATE OF CORRECTION

PATENT NO. : 6,893,957 B2
DATED : May 17, 2005
INVENTOR(S) : Jigish D. Trivedi et al.

It is certified that error appears in the above-identified patent and that said Letters Patent is hereby corrected as shown below:

<u>Column 5,</u>
Line 48, after "1/2 to" insert -- 2/3 --.

Signed and Sealed this

Twentieth Day of December, 2005

JON W. DUDAS
*Director of the United States Patent and Trademark Office*